(12) United States Patent
Sato et al.

(10) Patent No.: US 6,717,733 B2
(45) Date of Patent: Apr. 6, 2004

(54) COLLIMATOR ARRAY

(75) Inventors: Yoshiro Sato, Osaka (JP); Yoshihide Yasuda, Osaka (JP); Minoru Taniyama, Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 0 days.

(21) Appl. No.: 10/330,410

(22) Filed: Dec. 27, 2002

(65) Prior Publication Data

US 2003/0128437 A1 Jul. 10, 2003

(30) Foreign Application Priority Data

Dec. 28, 2001 (JP) ......................... 2001-401040

(51) Int. Cl.[7] .......................... G02B 27/10; G02B 6/26; G02B 6/32; H04B 10/04
(52) U.S. Cl. ...................... 359/619; 359/621; 359/652; 385/16; 385/17; 385/33; 385/34; 385/35; 398/201; 398/183; 398/188
(58) Field of Search ................... 359/619, 621, 359/622, 652; 385/16, 17, 18, 33, 34, 35; 398/13, 21, 183, 188, 201

(56) References Cited

U.S. PATENT DOCUMENTS

| 5,612,824 | A | * | 3/1997 | Si et al. ...................... 359/652 |
| 5,790,314 | A | * | 8/1998 | Duck et al. .................. 359/654 |
| 6,253,007 | B1 | * | 6/2001 | Laughlin ...................... 385/34 |
| 6,275,317 | B1 | * | 8/2001 | Doerr et al. .................. 398/201 |
| 6,404,955 | B1 | * | 6/2002 | Kikuchi et al. ................ 385/35 |
| 6,411,753 | B1 | * | 6/2002 | Ao ............................ 385/17 |
| 6,449,098 | B1 | * | 9/2002 | Helkey et al. ............... 359/619 |
| 2002/0031301 | A1 | * | 3/2002 | Sasaki et al. ................. 385/34 |
| 2002/0041448 | A1 | * | 4/2002 | Fukuzawa et al. ........... 359/652 |
| 2002/0094162 | A1 | * | 7/2002 | Li et al. ....................... 385/34 |
| 2002/0094163 | A1 | * | 7/2002 | Ooyama et al. ............... 385/34 |
| 2003/0063853 | A1 | * | 4/2003 | Huang et al. ................. 385/34 |
| 2003/0142907 | A1 | * | 7/2003 | Mao et al. .................... 385/33 |

* cited by examiner

*Primary Examiner*—Loha Ben
(74) *Attorney, Agent, or Firm*—Fish & Richardson P.C.

(57) ABSTRACT

A collimator array includes a plurality of collimators. Each collimator includes a lens and an optical fiber optically coupled to the lens. The lens is arranged so that its optical axis is parallel to one another. In each collimator, a core axis of the optical fiber is positioned relative to the optical axis of the lens so that an optical beam is emitted from a predetermined position at a predetermined angle.

17 Claims, 8 Drawing Sheets

Offset by 90 μm

Offset by 86 μm

COLLIMATOR ARRAY

CROSS REFERENCE TO RELATED APPLICATIONS

Pursuant to 35 USC §119, this application claims the benefit of Japan Patent Application No. 2001-401040 filed Dec. 28, 2001.

BACKGROUND OF THE INVENTION

The present invention relates to a collimator array including a plurality of collimators.

A typical optical collimating apparatus includes two opposed collimator arrays. The first collimator array has collimator lenses to convert the light emitted from optical fibers to collimated beams of light. The second collimator array converges and couples the collimated beams of light in an optical fiber with a collimator lens. Gradient index rod lenses having predetermined gradient indexes in the radial direction are employed as the collimator lenses of the first and second collimator arrays.

Optical devices, such as an optical filter, an optical isolator, and an optical switch, are arranged between the first and second collimator arrays. The optical collimating apparatus affects the light transmitted from the optical fibers of the first collimator array in a predetermined manner and couples the light in the corresponding optical fibers of the second collimator array.

FIG. 1 is a schematic diagram of a collimator array 100 used in a prior art optical collimating device. The collimator array 100 includes a plurality of single fiber collimators that are positioned by V-grooves formed on a base plate. Each single fiber collimator includes a gradient index rod lens 1, a single mode optical fiber 2, a capillary 3 for holding the optical fiber 2, and a glass tube 4 for holding the capillary 3 and the rod lens 1. The core axis of the optical fiber 2 coincides with the optical axis of the rod lens 1.

The collimator array 100 of the prior art collimator array 100 has the problems described below.

(1) The rod lens 1 must be positioned to adjust the angle of the beam emitted from the rod lens 1 of each collimator. To align each collimator, the collimator must be rotated as shown by the arrow in FIG. 1 in accordance with data of the light emission angle while detecting the beam direction. In this case, the detection of the beam direction of each collimator is difficult. Further, it takes time to align each collimator so that the emission angle of the collimator beam is the same as that of other collimator beams.

(2) To shorten the time for aligning the collimators, the beam emission angles of a plurality of collimators may be monitored in real time. However, this requires high technology and expensive equipment.

(3) When the beam emission position of each collimator must be corrected, further adjustment of the collimator is necessary.

SUMMARY OF THE INVENTION

It is an object of the present invention to provide a collimator array that facilitates the alignment of the optical axis.

To achieve the above object, the present invention provides a collimator array for use with a light source. The collimator array includes a plurality of collimators, each including a lens and an optical fiber optically coupled to the lens with the lenses of the collimators arranged so that the optical axes of the lenses are parallel to one another. In each collimator, a core axis of the optical fiber is positioned relative to the optical axis of the lens so that when receiving light from the light source, an optical beam is emitted from a predetermined position on an exit end surface of the lens at a predetermined angle.

A further aspect of the present invention is a method for manufacturing a collimator array. The collimator array includes a plurality of collimators, each having a lens and an optical fiber optically coupled to the lens. The method includes the step of preparing a first lens block and a second lens block with the first lens block including a plurality of first lens holding grooves and a plurality of first lens block positioning grooves, and the second lens block including a plurality of second lens holding grooves, each opposed to an associated one of the first lens holding grooves, and a plurality of second lens block positioning grooves, each opposed to an associated one of the first lens block positioning grooves. The method further includes the step of preparing a first fiber block and a second fiber block with the first fiber block including a plurality of first fiber holding grooves and a plurality of first fiber block positioning grooves, and the second fiber block including a plurality of second fiber holding grooves, each opposed to an associated one of the first fiber holding grooves, and a plurality of second fiber block positioning grooves, each opposed to an associated one of the first fiber block positioning grooves. Further, the method includes the steps of arranging the lenses of the collimators in the second lens holding grooves, arranging the optical fibers of the collimators in the second fiber holding grooves, engaging a plurality of guide pins with the second lens block positioning grooves and the second fiber block positioning grooves, placing the first lens block on the second lens block so that the first lens holding grooves are opposed to the second lens holding grooves with the lenses located in between, and placing the first fiber block on the second fiber block so that the first fiber holding grooves are opposed to the second fiber holding grooves with the optical fibers located in between.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
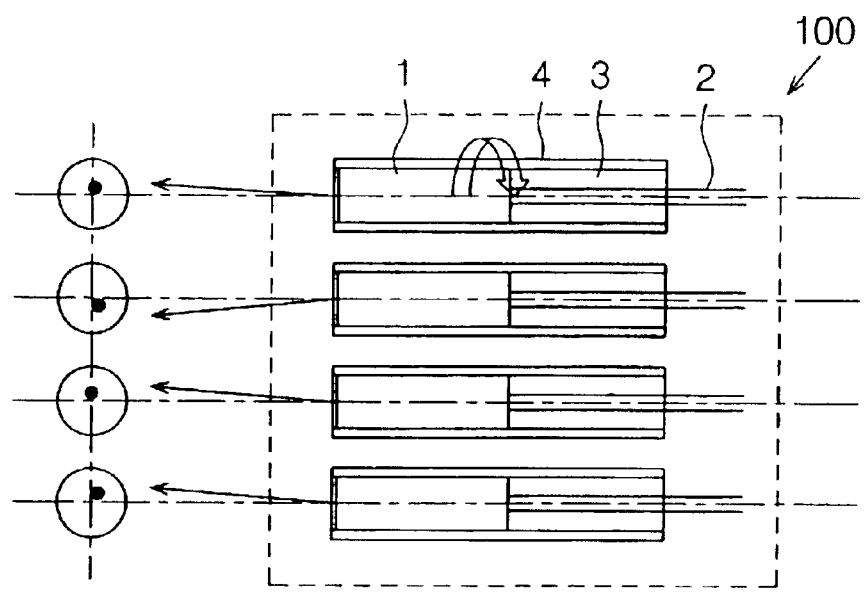
FIG. 1 is a schematic diagram illustrating a prior art collimator array.

In the drawings, like numerals are used for like elements throughout.

A collimator used in each embodiment will now be discussed with reference to FIGS. 2 and 3.

Figure 2:
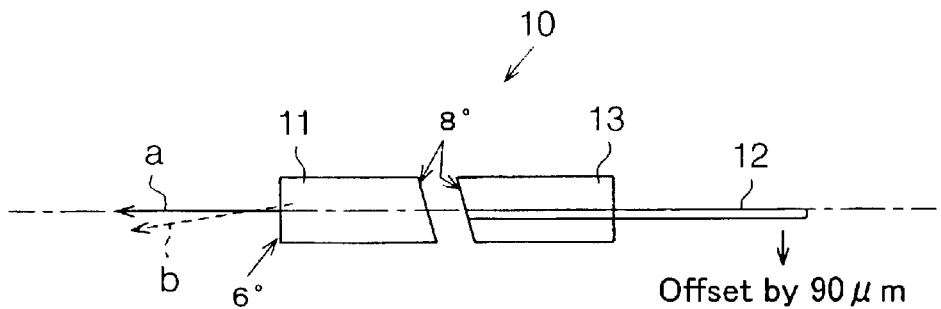
FIG. 2 is a schematic diagram illustrating a collimator used in each embodiment of the present invention.

FIG. 2 shows a collimator 10 including a gradient index rod lens 11, a single mode optical fiber 12, and a capillary 13. An end surface of the optical fiber 12 and an end surface of the rod lens 11 are separated from one another in accordance with a focusing distance. The end surface of the optical fiber 12 and the two end surfaces of the rod lens 11 are ground diagonally to prevent reflection. Thus, the light from the optical fiber 12 is prevented from being reflected by the end surface of the rod lens 11 and returned to the light source.

The rod lens 11 has a focusing distance of 2.414 mm, a lens length Z of 2.927 mm, and a beam waist of 50 mm. The collimator 10 is manufactured so that its beam b has an emission angle of 20 and an emission position located 50 μm above the lens center when the core axis of the optical fiber 12 coincides with the optical axis of the rod lens 11.

Further, by offsetting the core axis of the optical fiber 12 downward by 90 μm from the optical axis of the rod lens 11 as in the state of FIG. 2, the emission beam a of the collimator 10 has an emission angle of 0° and an emission position coinciding with the lens center.

Figure 3:
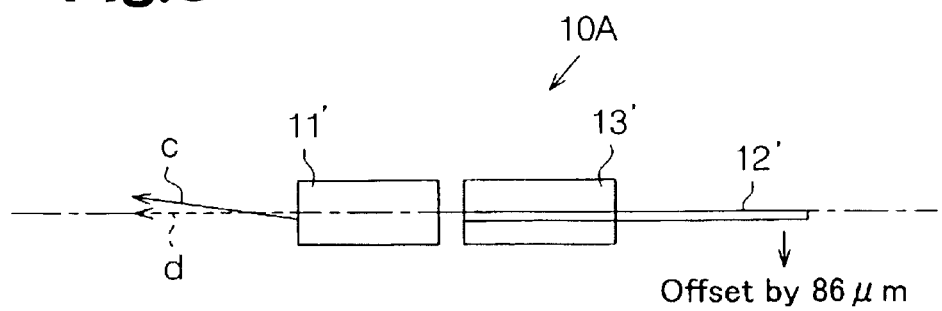
FIG. 3 is a schematic diagram illustrating a further collimator used in each embodiment of the present invention.

FIG. 3 shows a collimator 10A including a rod lens 11', an optical fiber 12', and a capillary 13'. In the collimator 10A, an end surface of the optical fiber 12' and the two end surfaces of the rod lens 11' are each ground and flattened. The collimator 10A is manufactured so that its emission beam d has an emission angle of 0° and an emission position coinciding with the lens center when the core axis of the optical fiber 12' coincides with the optical axis of the rod lens 11'.

As apparent from the collimators 10, 10A, the core axis of the optical fiber is offset upward or downward from the optical axis of the rod lens by a predetermined amount to obtain the required emission angle and emission position of the emission beam. Thus, in the preferred embodiment, the positional relationship between the optical axis of the rod lens and the core axis of the optical fiber in each collimator is set in accordance with the emission angle and emission position of the required emission beam.

Figure 4:
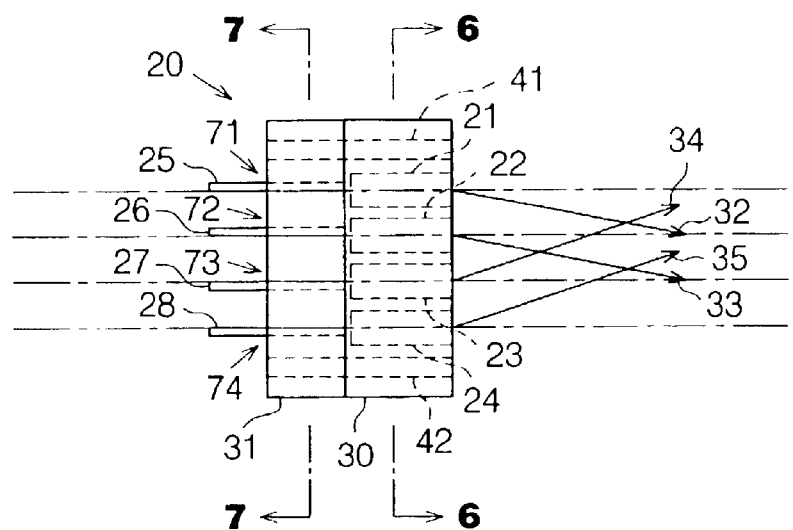
FIG. 4 is a schematic diagram showing a collimator array according to a first embodiment of the present invention.

FIG. 4 is a schematic diagram of a collimator array 20 according to a first embodiment of the present invention.

The collimator array 20 has four collimators 71–74, a lens block 30, and a fiber block 31. The collimator 71 includes a rod lens 21 and an optical fiber 25, and the collimator 72 includes a rod lens 22 and an optical fiber 26. The collimator 73 includes a rod lens 23 and an optical fiber 27, and the collimator 74 includes a rod lens 24 and an optical fiber 28. The optical fibers 25–28 each have an end surface separated by a focusing distance from an end surface of the associated rod lens 21–24.

Figure 5:
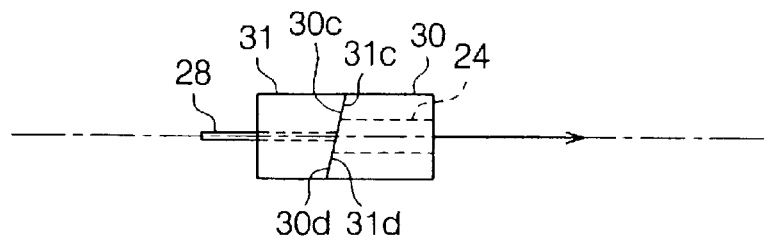
FIG. 5 is aside view showing the collimator array of FIG. 4.

The lens block 30 has four V-grooves to hold the rod lenses 21–24 so that their optical axes are parallel to one another and spaced equally from one another. The fiber block 31 has four V-grooves to hold the optical fibers 25–28 so that their core axes are parallel to one another and satisfy a predetermined positional relationship relative to the optical axes of the associated rod lens 21–24. In each collimator 71–74, the core axis of the optical fiber is parallel to the optical axis of the lens. As shown in FIG. 5, the bonding surfaces (30c, 30d, 31c, 31d) of the lens block 30 and the fiber block 31 are ground diagonally to prevent reflection.

Figure 6:
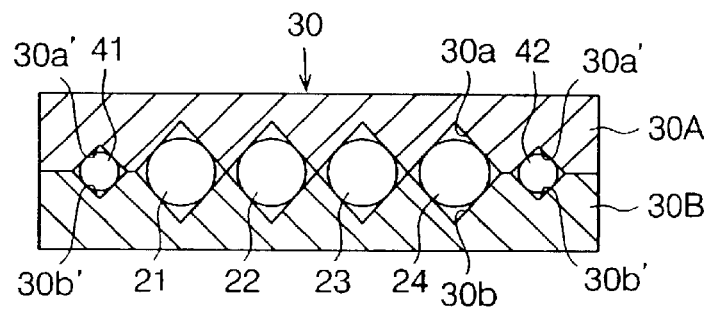
FIG. 6 is a cross-sectional view taken along line 6—6 in FIG. 4.

As shown in the cross-sectional view of FIG. 6, the lens block 30 includes an upper block (first lens block) 30A and a lower block (second lens block) 30B, which are bonded to each other along a plane on which the optical axis of each rod lens 21–24 lies. The blocks 30A, 30B each have four equally spaced V-grooves (first lens holding grooves, second lens holding grooves) 30a, 30b to position the rod lenses 21–24. The V-grooves 30a, 30b are arranged between V-grooves (first lens block positioning grooves, second lens block positioning grooves) 30a', 30b', which are used to position guide pins 41, 42.

Figure 7:
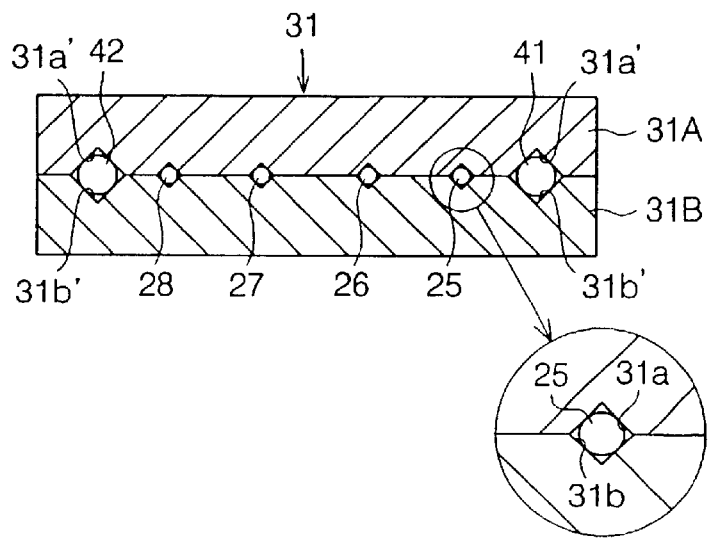
FIG. 7 is a cross-sectional view taken along line 7—7 in FIG. 4.

As shown in the cross-sectional view of FIG. 7, the fiber block 31 includes an upper block (first fiber block) 31A and a lower block (second fiber block) 31B, which are bonded to each other along a plane on which the core axis of each optical fibers 25–28 lies. The blocks 31A, 31B each have four V-grooves (first fiber holding grooves, second fiber holding grooves) 31a, 31b to position the optical fibers 25–28. The V-grooves 31a, 31b are arranged between V-grooves (first fiber block positioning grooves, second fiber block positioning grooves) 31a', 31b', which are used to position the guide pins 41, 42.

The guide pins 41, 42 are arranged between the left and right V-grooves 30a', 30b' of the lens block 30 and the left and right V-grooves 31a', 31b' of the fiber block 31. In this state, the blocks 30, 31 are positioned to satisfy the predetermined positional position of the core axes of the optical fibers 25–28 relative to the optical axes of the rod lens 21–24.

In the first embodiment, it is required that the beams 32, 33 of the collimators 71, 72 be emitted diagonally downward in the same angle from the same position relative to the optical axes of the associated rod lenses 21, 22. The positional relationship between the core axes of the optical fibers 25, 26 and the optical axes of the rod lenses 21, 22 are determined in accordance with the required emission angle and emission position. More specifically, as shown in FIG. 4, the optical fibers 25, 26 are offset upward by a predetermined amount from the optical axes of the associated rod lenses 21, 22.

It is required that the emission beams 34, 35 of the collimators 73, 74 be emitted diagonally upward in the same angle from the same position relative to the optical axes of the associated rod lenses 34, 35. The positional relationship between the core axes of each optical fiber 27, 28 and the optical axis of the associated rod lens 23, 24 is determined in accordance with the required emission angle and emission position. More specifically, as shown in FIG. 4, the optical fibers 27, 28 are offset downward by a predetermined amount from the optical axes of the associated rod lenses 23, 24.

An example of a procedure for assembling the collimator array 20 will now be discussed.

(S1) The rod lenses 21–24 are arranged in the V-grooves 30b of the lower block 30B of the lens block 30.

(S2) The optical fibers 25–28 are arranged in the V-grooves 31b of the lower block 31B.

(S3) The guide pins 41, 42 are engaged with the left and right V-grooves 30b' of the lower block 30B and the left and right V-grooves 31b' of the lower block 31B.

(S4) The upper block 30A of the lens block 30 is placed on the lower block 30B, and the upper block 31A of the fiber block 31 is placed on the lower block 31B.

(S5) In this state, one of the blocks 30, 31 is moved in the Z-axis direction (i.e., the direction of the optical axis of the rod lens) so that the bonding surfaces (30c, 30d, 31c, 31d) of the blocks 30, 31 contact each other (refer to FIG. 5).

(S6) Subsequently, ultraviolet curing resin, which is applied to the necessary bonding portions, are irradiated with ultraviolet rays to bond the bonding portions. This completes the collimator array 20. In the collimator array 20, the optical axes of the lenses 21–24 and the core axes of the optical fibers 25–28 satisfy the predetermined positional relationship and obtain the required emission angles of the emission beams 32–35 for each collimator.

The collimator array 20 of the first embodiment has the advantages described below.

(1) The rod lenses 21–24 and the optical fibers 25–28 are engaged with the V-grooves of the lens block 30 and the V-grooves of the fiber block 31, respectively. This obtains the required emission angles and emission positions of the emission beams for each collimator. Thus, there is no need for complicated alignment such as matching the emission angles of the emission beams in the collimators 71–74. Further, the emission positions of the collimators 71–74 do not have to be corrected. This facilitates the optical axis alignment of the rod lenses and the optical fibers and reduces the manufacturing cost of the collimator array.

(2) The rod lenses 21–24 and the optical fibers 25–28 are arranged in the V-grooves of the blocks 30, 31 and the blocks 30, 31 are bonded at predetermined positions to form the collimator array 20. Thus, the predetermined positional relationship between the optical axes of the rod lenses and the core axes of the optical fibers in each collimator is easily satisfied.

(3) The rod lenses 21–24 are held in the lens block 30 and the optical fibers 25–28 are held in the fiber block 31. Thus, there is no need for capillaries and glass tubes. This decreases the cost of the collimator array.

(4) The two guide pins 41, 42 facilitate positioning of the blocks 30, 31 at the predetermined positions. Thus, the positioning of the rod lenses and the optical fibers is satisfied by either performing alignment along the Z-axis (optical axis) direction or without performing alignment.

(5) The rod lenses 21–24 are held in the lens block 30, and the optical fibers 25–28 are held in the fiber block 31. The blocks 30, 31 are bonded integrally with the end surfaces (bonding surfaces) (30c, 30d, 31c, 31d) of the blocks 30, 31, which are ground diagonally to prevent reflection. Thus, reflections are prevented in a simple manner in the collimator array 20.

(6) Referring to FIG. 4, the emission beams of the collimators 71, 72 are emitted at the same emission angle diagonally downward relative to the optical axes of the rod lenses 21, 22. The emission beams of the collimators 73, 74 are emitted in the same emission angle diagonally upward relative to the optical axes of the rod lenses 23, 24.

(7) Since the rod lenses 21–25 are cylindrical, the rod lenses 21–25 may be held in the lens block 30 by forming V-grooves, which function as a lens holding portion for positioning and holding each lens 21–25.

(8) The employment of the rod lenses 21–25 enlarges the spot diameter of the emission beams.

(9) The employment of the rod lenses 21–25 enables far-distance collimating. Thus, the resulting collimating optical apparatus has a large maximum collimating length (i.e., distance between opposing rod lenses) and a high coupling efficiency. As a result, the collimating optical apparatus has a long light path length and may be used in a physically large optical device (e.g., large scale matrix switch).

Figure 8:
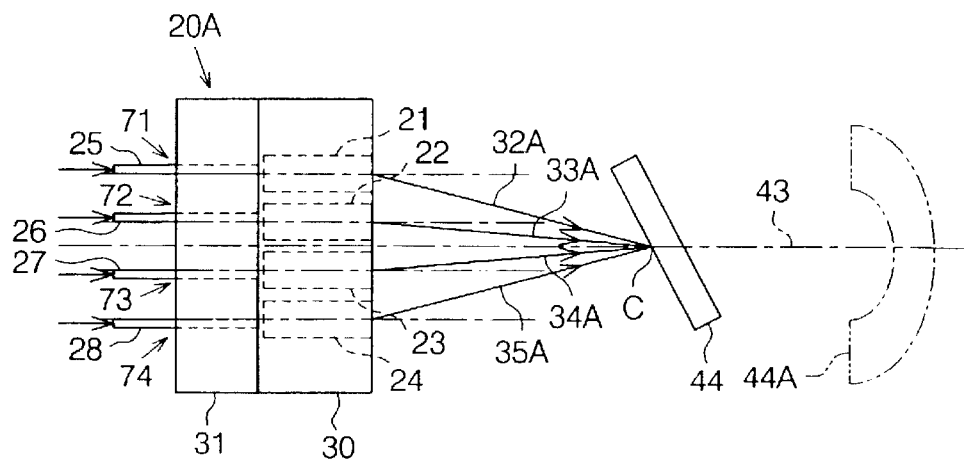
FIG. 8 is a schematic diagram of a collimator array according to a second embodiment of the present invention.

FIG. 8 is a schematic diagram of a collimator array 20A according to a second embodiment of the present invention. In the collimator array 20A, the positional relationship between the optical axis of the rod lens and the core axis of the optical fiber in each of the collimators 71–74 is determined such that the emission beams of the collimators 71–74 are substantially converged to point C. Point C lies along a center line 43, which is parallel to the optical axis of each rod lens and extends through the middle of the rod lenses 22, 23.

In the second embodiment, as shown in FIG. 8, the emission beams 32A, 33A of the collimators 71, 72 extend diagonally downward at different emission angles relative to the optical axes of the corresponding rod lenses 21, 22. In accordance with the emission angles, the optical fibers 25, 26 are offset upward by a predetermined amount from the optical axes of the associated rod lenses 21, 22.

The emission beams 32A, 33A of the collimators 71, 72 extend diagonally downward at different emission angles relative to the optical axes of the associated rod lenses 21, 22. In accordance with the emission angles, the optical fibers 25, 26 are offset upward by a predetermined amount from the optical axes of the associated rod lenses 21, 22.

Figure 9:
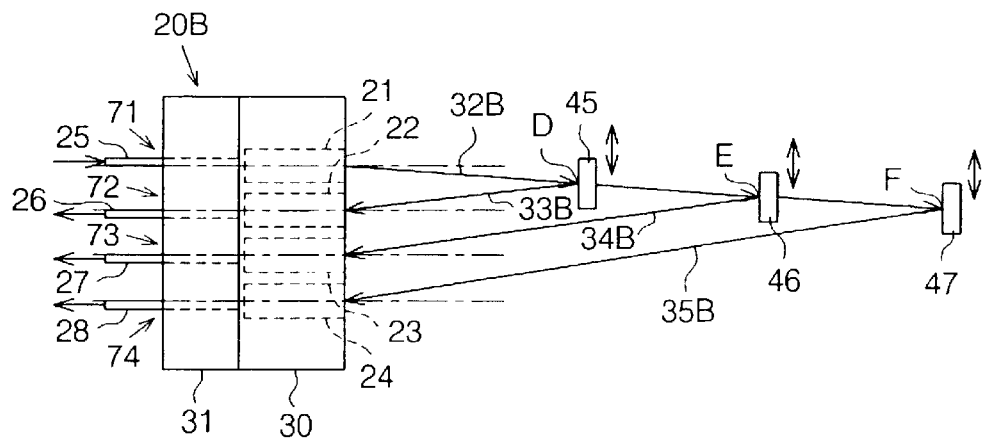
FIG. 9 is a schematic diagram of a collimator array according to a third embodiment of the present invention.

FIG. 9 is a schematic diagram of a collimator array 20B according to a third embodiment of the present invention. In the collimator array 20B, the positional relationship between the optical axes of the rod lenses and the core axes of the optical fibers are determined so that the emission beams of the collimators 72–74 intersect the emission beam of the collimator 71 at differing positions D–F.

In the third embodiment, as shown in FIG. 9, the emission beam 32B of the collimator 71 is emitted diagonally downward relative to the optical axis of the rod lens 21. The optical fiber 25 is offset upward by a predetermined amount from the optical axis of the associated rod lens 21 in accordance with the emission angle. In the collimators 72–74, the optical fibers 26–28 are offset downward by a predetermined amount from the optical axes of the associated rod lenses 23–25 so that the emission beams 33B, 34B, 35B (illustrated as reflection beam in FIG. 9) are emitted at the same angle to a position upward from the optical axes of the rod lenses 23–25.

The collimator array 20B of the third embodiment has the advantages described below.

As shown in FIG. 9, in the collimator array 20B, mirrors (pop up mirrors) 45–47 are arranged at three positions (positions D–F) where the emission beams 33B, 34B, 35B intersect the emission beams 33B, 34B, 35B. The mirrors 45–47 are movable in a direction perpendicular to the optical axes as shown by the arrows in FIG. 9. One of the mirrors 45–47 is arranged at the corresponding positions DF. For example, when the mirror 45 is arranged at position D, the mirror 45 reflects the emission beam 32B, and the reflection beam 33B enters the rod lens 22. When the mirror 46 is arranged at position E, the mirror 46 reflects the emission beam 32B, and the reflection beam 34B enters the rod lens 23. When the mirror 47 is arranged at position F, the mirror 47 reflects the emission beam 32B, and the reflection beam 35B enters the rod lens 24. When the mirror 47 is arranged at position F, the mirror 47 reflects the emission beam 32B, and the reflection beam 35B enters the rod lens 24. Accordingly, one of the mirrors 45–47 are shifted into the path of the emission beam 32B to send the emission beam 32B of the collimator 71 to one of the collimators 72–74.

Figure 10:
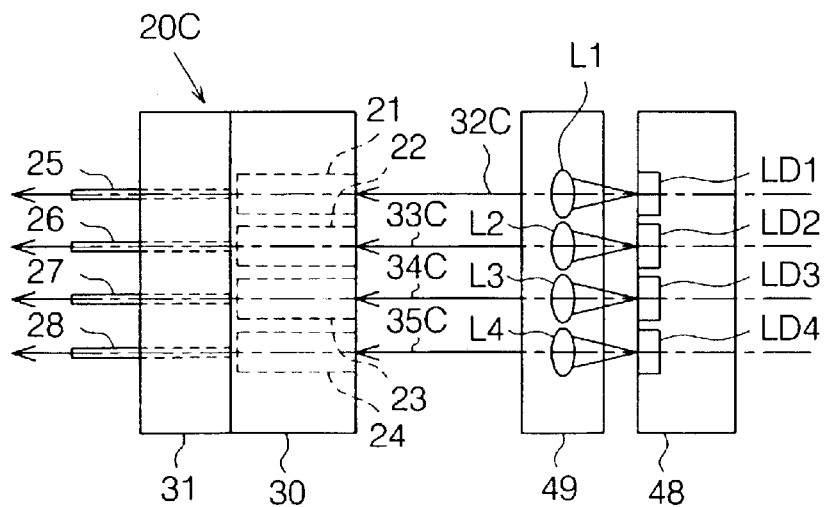
FIG. 10 is a schematic diagram of a collimator array according to a fourth embodiment of the present invention.
Figure 14:
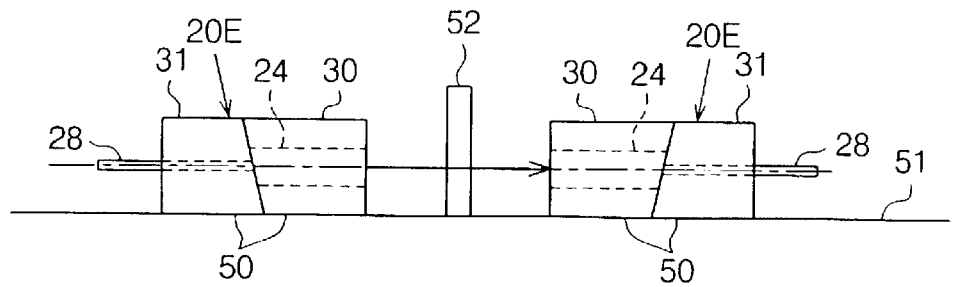
FIG. 14 is a side view of the collimator array of FIG. 13.

FIG. 10 is a schematic diagram of an optical module including a collimator array 20C according to a fourth embodiment of the present invention. The optical module includes a collimator array 20C, a laser diode array 48, and a micro lens array 49. The lens block 30 of the collimator array 20C, the block of the micro lens array 49, and the block of the laser diode array 48 each have a horizontal reference surface, which is parallel to the optical axes of the rod lenses 21–24. The horizontal reference surfaces of the collimator array 20C, the micro lens array 49, and the laser diode array 48 are arranged on a horizontal attaching surface (FIG. 14 shows an attaching surface 51) of a base plate or the like.

In the optical module, the light emitted from each laser diode LD1–LD4 of the laser diode array 48 is converted by associated micro lenses L1–L4 of the micro lens array 49 to emission beams 32C–35C, which are parallel beams of light. The emission beams 32C–35C enter the corresponding rod lenses 21–24. An optical device, such as an isolator (not shown), is arranged between the micro lens array 49 and the collimator array 20C. The isolator prevents the emission beams 32C–35C from being reflected by the end surfaces of the rod lenses or optical fibers of the collimator array and returned to the laser diodes. This stabilizes each laser diode.

In the collimator array 20C, the collimators 71–74 emit emission beams at the same angle (emission angle 0°). That is, the collimator array 20C receives the emission beams 32C–35C, which are parallel to the optical axes, from the micro lens array 49, and emits the emission beams 32C–35C as parallel beams of light.

The positional relationship between the core axes of the optical fibers 25–28 and the optical axes of the rod lenses 21–24 is determined in accordance with the emission angle (0°). More specifically, the core axes of the optical fibers 25–28 either coincides with the optical axes of the associated rod lenses 21–24 or are offset upward or downward from the optical axes by a predetermined amount.

The collimator array 20C of the fourth embodiment has the advantage described below.

Complicated alignment such as adjusting the emission angles and emission positions of beams is not necessary in the collimators 71–74.

Figure 11:
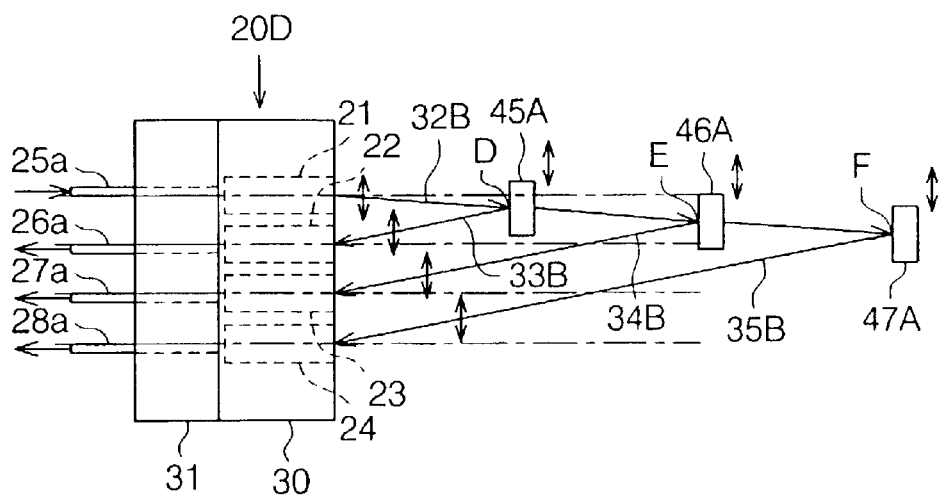
FIG. 11 is a schematic diagram of a collimator array according to a fifth embodiment of the present invention.
Figure 12A:
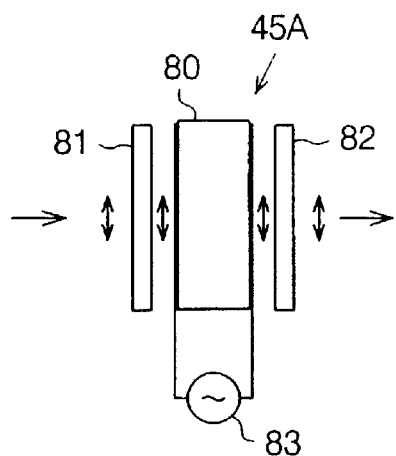
FIGS. 12A and 12B are explanatory views showing a variable polarization element of the collimator array of FIG. 11.
Figure 12B:
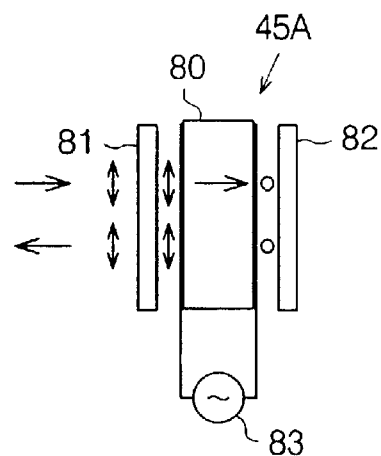

FIG. 11 is a schematic diagram of a collimator array 20D according to a fifth embodiment of the present invention. The collimator array 20D uses polarization maintaining optical fibers 25a–28a in lieu of the optical fibers 25–28 of the third embodiment shown in FIG. 9 and uses variable polarization elements 45A–47A in lieu of the mirrors 45–47 of the third embodiment. The other parts are the same as those of the third embodiment.

A PANDA type, bowtie type, or oval jacket type polarization type holding optical fiber, in which a stress application portion is defined in a clad, is employed.

The variable polarization elements 45A–47A each includes a Twisted Nematic (TN) type liquid crystal cell 80, a polarization element 81 and analyzer 82 arranged next to the cell 80, and a drive source 83. The polarization directions of the polarization element 81 and the analyzer 82 are the same. The drive source 83 applies ON, OFF voltage signals to the transparent electrodes of the liquid crystal cell 80.

When an ON voltage signal is applied to the liquid crystal cell 80, the light entering the polarization element 81 passes through the analyzer 82. When an OFF voltage signal is applied to the liquid crystal cell 80, the liquid crystal cell 80 changes the polarization state of the light entering the polarization element 81. Thus, the analyzer 82 reflects the light.

The polarization maintaining optical fibers 25a–28a have the same polarization direction (the directions shown by the arrows in FIG. 11) so that the light (polarization light) reflected by the analyzer 82 of each variable polarization element 45A–47A may be extracted. The adjustment of the polarization direction is performed by observing the core of each polarization maintaining optical fiber 25a–28a. That is, the core of each polarization maintaining optical fiber 25a–28a has a unique shape (e.g., bowtie-like shape). Thus, the unique shape enables the matching of the polarization directions.

In the collimator array 20D, when an OFF voltage signal is applied to the liquid crystal cell 80 of the variable polarization element 45A located at position D, the analyzer 82 reflects the emission beam 32B to the rod lens 22. When an OFF voltage signal is applied to the liquid crystal cell 80 of the variable polarization element 46A located at position E, the analyzer 82 reflects the emission beam 32B to the rod lens 23. When an OFF voltage signal is applied to the liquid crystal cell 80 of the variable polarization element 47A located at position F, the analyzer 82 reflects the emission beam 32B to the rod lens 24.

The collimator array 20D of the fifth embodiment has the advantage described below.

The application of an ON voltage and an OFF voltage to the liquid crystal cell 80 of each variable polarization element 45A–47A sends the beam emitted from one of the collimators 71 to one of the remaining collimators 72–74 without using the movable mirrors 45–47 of FIG. 9.

Figure 13:
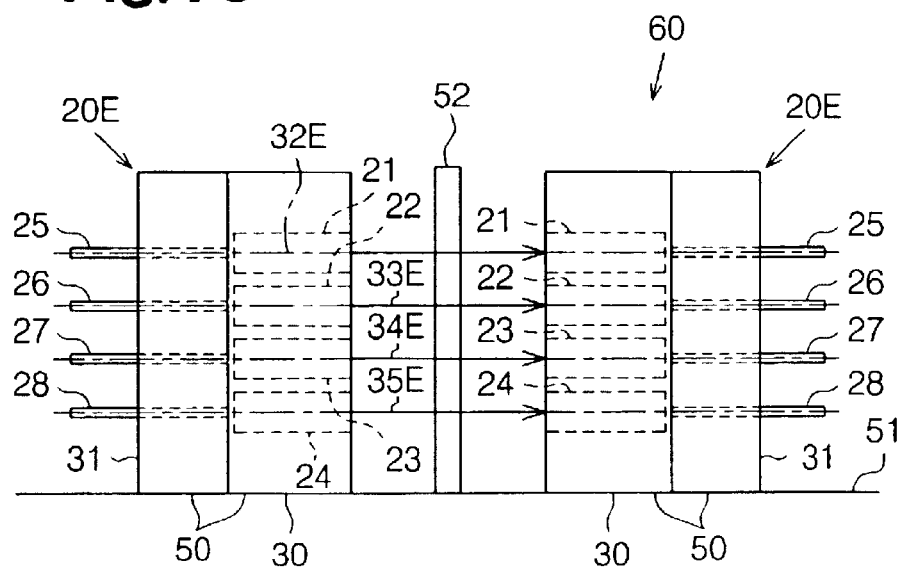
FIG. 13 is a schematic diagram of a collimator array according to a sixth embodiment of the present invention.

FIG. 13 is a schematic diagram of a filter array module 60 including a collimator array 20E according to a sixth embodiment of the present invention. FIG. 14 is a side view of FIG. 13.

In the collimator array 20E, the positional relationship between the optical axes of the rod lenses and the core axes of the optical fibers 25–28 in each collimator is determined so that the angles of the emission beams emitted from the four collimators 71–74 are each 0°.

In the sixth embodiment, the emission beams 32E–35E of the four collimators 71–74 are emitted in the direction of the optical axes of the rod lenses 21–24. In accordance with the emission angles, the core axis of each optical fiber 25–28 is either matched with the optical axis of the associated rod lens 21–24 or offset upward or downward by a predetermined amount from the optical axis.

The lens block 30 and fiber block 31 of the collimator array 20E each have a horizontal reference surface 50, which is parallel to the optical axis of each rod lens 21–24.

Each horizontal reference surface 50 is placed on the attaching surface 51 so that the two collimator arrays 20E are opposed to each other on a horizontal attaching surface 51. The filter array module 60 further includes a filter 52 arranged in the paths of the beams between the two collimator arrays 20E.

The collimator array 20E of the sixth embodiment has the advantages described below.

The beams 32E–35E emitted from the four collimators are each emitted at an angle of 0°, and the horizontal reference surface 50 defined on each of the blocks 30, 31 is parallel to the optical axes of the rod lenses 21–24. Thus, when manufacturing the filter array module 60, the two collimator arrays 20E are arranged based on a plane by just arranging the horizontal reference surfaces 50 of the two collimator arrays 20E on the horizontal attaching surface 51. This facilitates the manufacturing of a filter array module using the two collimator arrays 20E and the filter 52.

Figure 15:
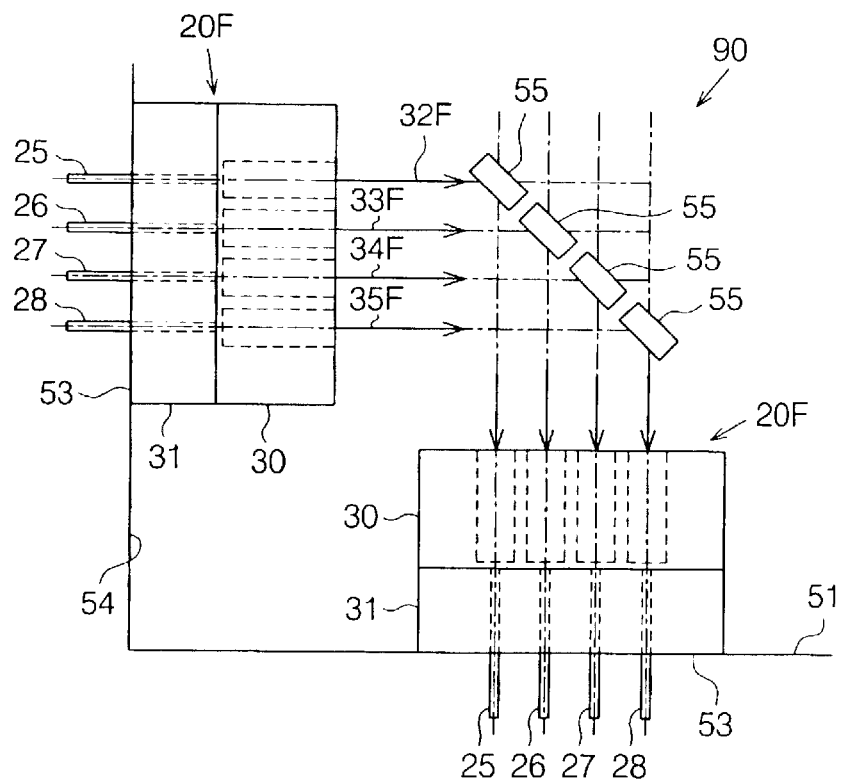
FIG. 15 is a schematic diagram of a collimator array according to a seventh embodiment of the present invention.

FIG. 15 is a schematic diagram of an optical switch 90 including a collimator array 20F according to a seventh embodiment of the present invention. In the collimator array 20F, the positional relationship between the optical axis of the rod lens and the core axis of the optical fiber in each collimator is set so that the emission angles of the beams 32F–35F emitted from the collimators 71–74 are each 0°. A vertical reference surface 53 perpendicular to the optical axes of the rod lenses 21–24 is defined on the fiber block 31 of the collimator array 20F.

The optical switch 90 includes two collimator arrays 20F and four mirrors 55. The vertical reference surface 53 of one of the two collimator arrays 20F is arranged on the horizontal attaching plate 51 of a base plate and fixed to the attaching surface 51. The vertical reference surface 53 of the other one of the collimator arrays 20F is engaged with a vertical attaching surface of the base plate and fixed to the attaching surface 54. In this state, the two collimator arrays 20F are opposed to each other at an angle of 90 degrees. Four mirrors 55 are arranged at sections where the parallel beams of the two collimator array 20F intersect one another.

In the optical switch 90, each mirror is arranged at points in which four emission beams (parallel beams) of one of the collimator array 20F intersects four emission beams (parallel beams) of the other one of the collimator array 20F. An actuator (not shown) driven, for example, by a control signal from a (controller) moves the four mirrors vertically with the reflection angles maintained in the state shown in FIG. 15. When the actuator moves one of the mirrors 55 to a certain intersection, the mirror 55 reflects the corresponding emission beam of the input side collimator array (e.g., the collimator array at the side of the attaching surface 54) to the corresponding fiber of the output side collimator array 20F.

The collimator array 20F of the seventh embodiment has the advantage described below.

The angles of the beams 32F–35F emitted from the four collimators 71–74 are each set at 0°, and a vertical reference surface 53 perpendicular to the optical axes of the rod lenses 21–24 is defined on the fiber block 31. Thus, when manufacturing the optical switch 90, the vertical reference surface 53 of one of the two collimator arrays 20F is arranged on the horizontal attaching surface 51 and fixed to the attaching surface 51. The vertical reference surface 53 of the other one of the collimator arrays 20F is engaged with the vertical attaching surface 54 and fixed to the attaching surface. The mirrors 55 are arranged at the intersections of the two collimator arrays 20F, and the manufacturing of a module of the optical switch 90 with the two collimator arrays 20F and the mirrors 55 is facilitated.

Figure 16:
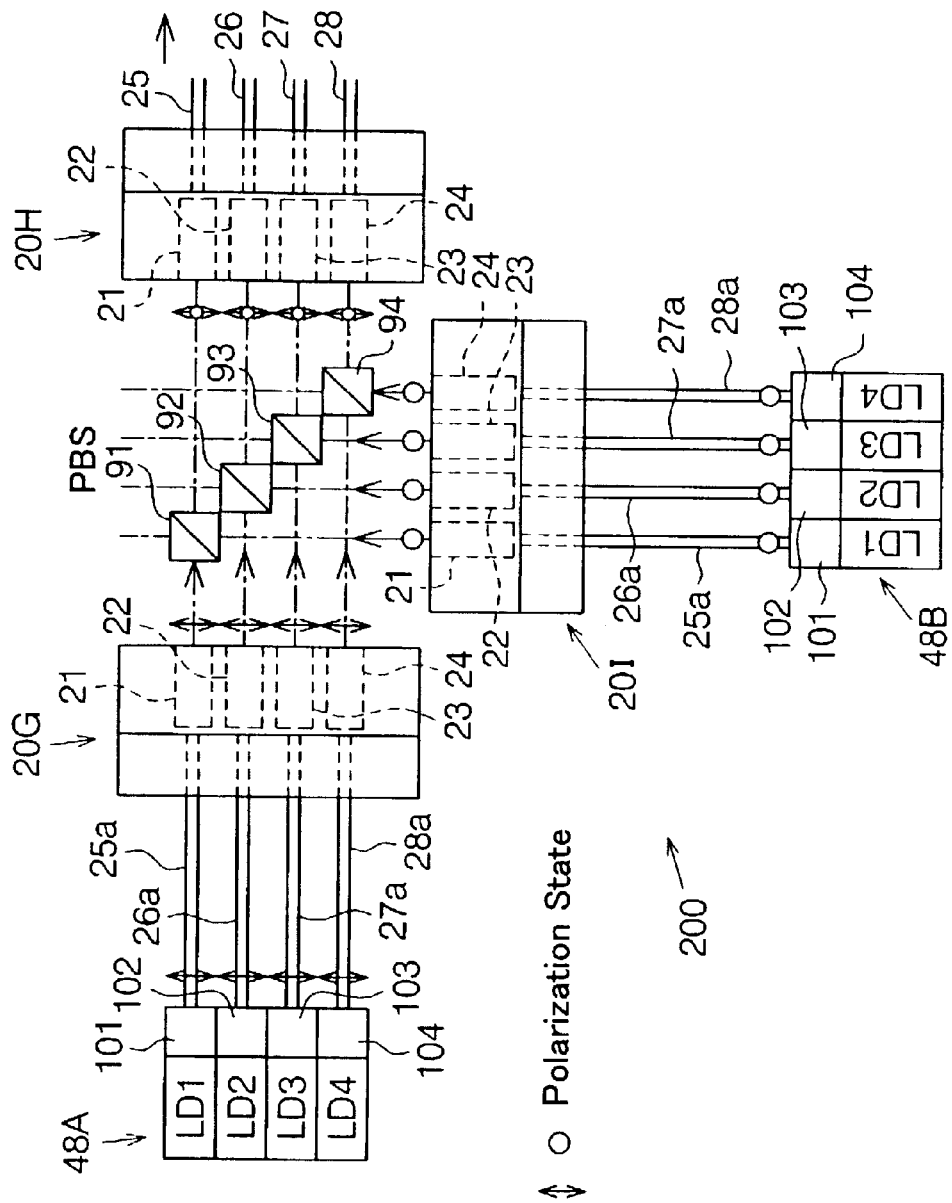
FIG. 16 is a schematic diagram of a collimator array according to an eighth embodiment of the present invention.

FIG. 16 is a schematic diagram of a polarization synthesizing module 200, which includes a collimator array according to an eighth embodiment of the present invention. A polarization synthesizing module 200 uses optical fibers 25a–28a to synthesize each emission beam from a light source (laser diode array). The polarization synthesizing module 200 includes three collimator arrays 20G, 20H, 20I.

As shown in FIG. 16, the collimator arrays 20G, 20H are arranged opposing each other, and the collimator arrays 20G, 20I are arranged perpendicular to each other. The collimator arrays 20G, 20I include polarization maintaining fibers 25a–28a. Four polarization beam splitters (PBS) 91–94 are arranged in the paths of the parallel light beams of the three collimator arrays 20G, 20H, 20I.

Polarization elements 101–104 polarize the emission beams of laser diodes LD1–LD4 in a laser diode array 48A into polarization components, which are vertical to the plane of FIG. 16. The emission beams polarized by the polarization elements 101–104 enter the polarization maintaining optical fibers 25a–28a of the collimator array 20G.

The polarization elements 101–104 polarize the emission beams of laser diodes LD1–LD4 in a laser diode array 48B into polarization components, which are vertical to the plane of FIG. 16. The emission beams polarized by the polarization elements 101–104 enter the polarization maintaining optical fibers 25a–28a of the collimator array 20I.

The PBSs 91–94 synthesize the polarized beams emitted from the rod lenses 21–24 of the collimator array of the collimator array 20G with the polarized beams emitted from the rod lenses 21–24. The synthesized and strengthened polarized beams enter the rod lenses 21–24 of the collimator array 20H.

In the eighth embodiment, the collimator arrays 20G, 20H, 20I are used to easily form the polarization synthesizing module 200.

It should be apparent to those skilled in the art that the present invention may be embodied in many other specific forms without departing from the spirit or scope of the invention. Particularly, it should be understood that the present invention may be embodied in the following forms.

In each of the above embodiments, the number of collimators in a collimator array is not limited to four.

In each of the above embodiments, a plurality of micro lenses, such as those shown in FIG. 10, may be used in lieu of the rod lenses.

In each of the above embodiments, the lens block 30 may include only the upper block 30A.

In each of the above embodiments, semi-cylindrical grooves may be formed in lieu of the V-grooves 30a, 30b of the lens block 30. Likewise, semi-cylindrical grooves may be formed in lieu of the V-grooves 31a', 31b' of the fiber block 31.

In the second embodiment, a concave mirror 44A, which is shown by the broken lines in FIG. 8, may be employed in lieu of the mirror 55 of FIG. 8.

In the sixth embodiment, an optical device other than the filter 52 may be used.

In the eighth embodiment, an optically uniaxial birefringent crystal may be used in lieu of the PBSs 91–94.

The present examples and embodiments are to be considered as illustrative and not restrictive, and the invention is not to be limited to the details given herein, but may be modified within the scope and equivalence of the appended claims.

What is claimed is:

1. A collimator array for use with a light source, the collimator array comprising:
   a plurality of collimators, each including a lens and an optical fiber optically coupled to the lens with the lenses of the collimators arranged so that the optical axes of the lenses are parallel to one another, and in each collimator, a core axis of the optical fiber is positioned relative to the optical axis of the lens so that when receiving light from the light source, an optical beam is emitted from a predetermined position on an exit end surface of the lens at a predetermined angle.

2. The collimator lens according to claim 1, further comprising:
   a lens block having a plurality of lens holding grooves for respectively holding the lenses so that the optical axes of the lenses are equally spaced; and
   a fiber block having a plurality of fiber holding grooves for respectively holding the optical fibers so that the core axis of each optical fiber is arranged at a predetermined position relative to the optical axis of an associated one of the lenses.

3. The collimator array according to claim 2, wherein the lens block includes a plurality of lens block positioning grooves, and the fiber block includes a plurality of fiber block positioning grooves, each associated with one of the lens block positioning grooves, the collimator array further comprising:
   a plurality of guide pins engaged with the lens block positioning grooves and the fiber block positioning grooves to position the lens block and the fiber block.

4. The collimator array according to claim 2, wherein the lens block and the fiber block each include a diagonal bonding surface.

5. The collimator array according to claim 2, wherein, in each collimator, the core axis of the optical fiber is positioned relative to the optical axis of the lens so that the optical beam of the collimator is emitted at an angle of 0° relative to the optical axis of the lens.

6. The collimator array according to claim 5, wherein the lens block and the fiber block each have a horizontal reference surface that is parallel to the optical axis of each lens.

7. The collimator array according to claim 5, wherein the fiber block has a vertical reference surface perpendicular to the optical axis of each lens.

8. The collimator array according to claim 1, further comprising:
   a first lens block having a plurality of first lens holding grooves, which hold the lenses, and a plurality of first lens block positioning grooves; and
   a second lens block having a plurality of second lens holding grooves, each opposed to an associated one of the first lens holding grooves, and a plurality of second lens block positioning grooves, each opposed to an associated one of the first lens block positioning grooves.

9. The collimator array according to claim 1, further comprising:
   a first fiber block having a plurality of first fiber holding grooves, which hold the optical fibers, and a plurality of first fiber block positioning grooves; and
   a second fiber block having a plurality of second fiber holding grooves, each opposed to an associated one of the first fiber holding grooves, and a plurality of second fiber block positioning grooves, each opposed to an associated one of the first fiber block positioning grooves.

10. The collimator array according to claim 1, wherein, in each collimator, the core axis of the optical fiber is positioned relative to the optical axis of the lens so that the optical beam of the collimator converges at substantially the same position as the optical beams of the other collimators.

11. The collimator array according to claim 1, wherein, in each collimator, the core axis of the optical fiber is positioned relative to the optical axis of the lens so that the optical beam emitted from the collimator intersects the optical beams of the other collimators at different positions.

12. The collimator array according to claim 1, wherein each of the lenses comprises a gradient index rod lens.

13. The collimator array according to claim 1, wherein each of the optical fibers comprises a polarization maintaining optical fiber.

14. The collimator array according to claim 1, wherein the core axes of the optical fibers are parallel to one another, and in each collimator, the core axis of the optical fiber is parallel to the optical axis of the lens.

15. A method for manufacturing a collimator array, wherein the collimator array includes a plurality of collimators, each having a lens and an optical fiber optically coupled to the lens, the method comprising the steps of:
   preparing a first lens block and a second lens block with the first lens block including a plurality of first lens holding grooves and a plurality of first lens block positioning grooves, and the second lens block including a plurality of second lens holding grooves, each opposed to an associated one of the first lens holding grooves, and a plurality of second lens block positioning grooves, each opposed to an associated one of the first lens block positioning grooves;
   preparing a first fiber block and a second fiber block with the first fiber block including a plurality of first fiber holding grooves and a plurality of first fiber block positioning grooves, and the second fiber block including a plurality of second fiber holding grooves, each opposed to an associated one of the first fiber holding grooves, and a plurality of second fiber block positioning grooves, each opposed to an associated one of the first fiber block positioning grooves;
   arranging the lenses of the collimators in the second lens holding grooves;
   arranging the optical fibers of the collimators in the second fiber holding grooves;
   engaging a plurality of guide pins with the second lens block positioning grooves and the second fiber block positioning grooves;
   placing the first lens block on the second lens block so that the first lens holding grooves are opposed to the second lens holding grooves with the lenses located in between; and
   placing the first fiber block on the second fiber block so that the first fiber holding grooves are opposed to the second fiber holding grooves with the optical fibers located in between.

16. The method according to claim 15, further comprising the step of:
   bonding an end surface of the first lens block with an end surface of the first fiber block and end surface of the second lens block with an end surface of the second fiber block.

17. The method according to claim 16, wherein the bonding step includes:
   applying an ultraviolet curing resin to the end surfaces of the first and second lens blocks and the end surfaces of the first and second fiber blocks; and
   irradiating the ultraviolet curing resin with ultraviolet rays.

* * * * *